United States Patent
Fukuda et al.

(10) Patent No.: US 6,545,916 B2
(45) Date of Patent: Apr. 8, 2003

(54) MEMORY CONFIGURATION OF A COMPOSITE MEMORY DEVICE

(75) Inventors: Minoru Fukuda, Sanda (JP); Hiroaki Nakanishi, Kobe (JP); Kunio Matsudaira, Kobe (JP); Masahiro Matsuo, Kobe (JP); Hirohisa Abe, Sanda (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/989,841

(22) Filed: Nov. 20, 2001

(65) Prior Publication Data

US 2002/0031013 A1 Mar. 14, 2002

Related U.S. Application Data

(62) Division of application No. 09/628,825, filed on Jul. 31, 2000, which is a division of application No. 09/080,696, filed on May 18, 1998, now Pat. No. 6,115,292.

(30) Foreign Application Priority Data

May 23, 1997 (JP) ............................................... 9-149975

(51) Int. Cl.[7] ................................................ G11C 16/04
(52) U.S. Cl. ............................. 365/185.33; 365/185.11; 365/185.29
(58) Field of Search ....................... 365/185.33, 185.05, 365/185.29, 185.11, 218

(56) References Cited

U.S. PATENT DOCUMENTS

| | | | |
|---|---|---|---|
| 5,245,572 A | | 9/1993 | Kosonocky et al. |
| 5,297,096 A | | 3/1994 | Terada et al. |
| 5,343,434 A | * | 8/1994 | Noguchi ................. 365/185.04 |
| 5,361,343 A | | 11/1994 | Kosonocky et al. |
| 5,469,390 A | | 11/1995 | Sasaki et al. |
| 5,539,688 A | * | 7/1996 | Yiu et al. ............... 365/185.13 |
| 5,596,530 A | * | 1/1997 | Lin et al. ................ 365/185.11 |
| 5,630,093 A | * | 5/1997 | Holzhammer et al. ....... 711/115 |
| 5,715,193 A | | 2/1998 | Norman |
| 5,793,676 A | * | 8/1998 | Bedarida et al. ........ 365/185.12 |
| 5,818,848 A | | 10/1998 | Lin et al. |
| 5,821,909 A | | 10/1998 | Yiu et al. |
| 5,841,696 A | | 11/1998 | Chen et al. |
| 6,016,270 A | | 1/2000 | Thummalapally et al. |
| 6,034,897 A | * | 3/2000 | Estakhri et al. ......... 365/185.35 |
| 6,081,878 A | * | 6/2000 | Estakhri et al. .............. 711/168 |

* cited by examiner

*Primary Examiner*—David Nelms
*Assistant Examiner*—Thong Le
(74) *Attorney, Agent, or Firm*—Cooper & Dunham LLP

(57) ABSTRACT

The present invention is related to a composite flash memory device comprises a plural sector flash memory array which is divided to plural sector that is a minimum erasing unit of the flash memory device, a flash memory array storing control commands which control a total system of the composite flash memory device and/or the only composite flash memory device in and sharing I/O line of the plural sector flash memory array, the read operation of the flash memory array is enable when the plural sector flash memory array is gained access.

17 Claims, 6 Drawing Sheets

| /PFE | /DFE |
|---|---|
| 0 | 1 |

Program Store Area

| 1 | 0 |
|---|---|

Data Store Area

Address Space of Single Flash Memory

MEMORY CONFIGURATION OF A COMPOSITE MEMORY DEVICE

This is a continuation of application Ser. No. 09/628,825 filed Jul. 31, 2000 which is a divisional of Ser. No. 09/080, 696 filed May 18, 1998 which is now U.S. Pat. No. 6,115, 292.

FIELD OF THE INVENTION

This invention is generally related to a memory device of a whole category of electronic equipment aboard a computerized personal organizer, a handset, a voice recognition device, a voice memory device, and a computer etc. and more particularly related to a composite memory system of a flash memory device.

BACKGROUND OF THE INVENTION

There are many kind of memory devices, for example, mask ROM, erasable programmable read-only memory (EPROM), flash memory and so on. The mask ROM is sintered information data of control command etc in accordance with specifications of users with a production process. Therefore, the mask ROM is unable to rewrite the sintered information data after production. The EPROM is capable of erasing information data by irradiation with ultraviolet lights. However, the EPROM is also unable to electrically erase and rewrite the information data. Therefore, the flash memory device is receiving attention as one of a memory device among the electronic industry. Because of this, the flash memory device is becoming prevalent as an alternative memory device of the mask ROM and the EPROM.

As an electrically erasable memory device, there is an electrically erasable programmable read only memory (EEPROM). Erase operation of the conventional EEPROM is generally based upon one bit unit. On the other hand, erase operation of the flash memory is based upon block unit. Therefore, by the adoption of an erasing by block unit or being one unit of 1 bit, the flash memory device is paid attention as the next generation alternative memory of dynamic random access memory (DRAM) that the integration of the flash memory is far in excess of one of the DRAM market.

Furthermore, the flash memory has obtained a great support from user because of advantages that flash memory is capable of rewriting the data under on board and of being debugged until just before shipment.

Referring to FIG. 1, one of conventional prior arts in a memory system includes a flash memory such a single memory array 2. The memory array 2 has 4 M bits and is divided into plural sector. When the data in the memory element is distinguished under the control of CPU (not shown), the data is sequentially erased with sector unit from the first sector in the memory array 2 or with sector unit from selected sectors.

Address signal A0–A18 are applied an X decoder 6 and an Y decoder 8 with via an address latch 4. The X decoder 6 selects word line in the memory array 2. And also the Y decoder 8 selects bit line in the memory array 2 via an Y gate/sensing amplifier 10.

Programming voltage generator 14 generates a programming voltage for writing data in the memory device 2. Erase voltage generator 16 generates an erase voltage for erasing data in the memory device 2. The programming voltage generator 14 and the erase voltage generator 16 output the programming voltage and the erase voltage into the X decoder 6, the Y decoder 8, and the memory array 2 each other.

An input/output buffer 20 and a data latch 18 are employed for input or output of data. A timer 22 and a system control register 24 are also employed in this system. The system control register 24 input a write enable signal (/WE), an output enable signal (/OE), a chip enable signal (/CE) and voltage supply, Vcc, GND as control signals. The /WE signal is a start signal of the writing operation of the memory array 2. The /OE signal is a start signal of the reading operation of the memory array 2. Further, the /CE signal is a select signal whether the device 1 is selected or the other device is selected.

As for a flash memory, writing operation and erasing operation requires long time in comparison with reading operation. Therefore, a memory device is ideal if the CPU or the other controllers are capable of carrying out the reading operation of the data in the memory array 2 when the other area of the memory array 2 is written or erased under aboard a circuit board.

However, the memory device 1 as shown FIG. 1 can not carry out above mentioned parallel processing.

The 4 M bits capacity's flash memory 2 is formerly used. For example, when the above standard capacity's flash memory 2 is installed as a memory array and the size of software is bigger, the memory array 2 becomes lacking in memory capacity. Therefore, if the large size software is employed, the memory device needs to install a flash memory of the larger capacity. However, it is connected to a cost up to install the memory of the needlessly large capacity.

Thereupon, it is conceivable to employ the plural device as shown FIG. 1 in order to solve the above problem. Still furthermore, in this case, space savings is not able to be materialized, beside a cost goes up by setting up the same plural memory device.

A concurrent flash memory system such as disclosed in a specification of AT29C432 made of ATMEL Company. The contents of this reference being incorporated herein by reference. The above concurrent flash memory employs the two different type memories that are EEPROM and flash memory in a single device. The concurrent flash memory system of the ATMEL is capable of reading the data of the EEPROM while writing operation of the flash memory in one device.

However, the present inventor identified that the system of ATMEL requires the long time erasing the data on the memory device. Because the EEPROM employed by the system of ATMEL is possible only the writing and also erasing with one bit unit. Accordingly, one sector of the flash memory is 8 K byte unit and EEPROM of ATMEL unable to store comparatively large data such as a voice data to one sector. The EEPROM requires comparatively long time to erasing operation when the large size data such as voice etc. is stored and located in astride to plural sector of the flash memory.

Furthermore, the present inventor also identified that conventional erasing operation of the data on a memory requires long time in order to erase by the sector unit. The conventional erasing operation is a single sector erasing mode and a plural sector erasing mode. Although the plural sector erasing mode can erase some number of sectors on the flash memory, the selected plural sector is erased to each sector in turn.

Although the flash memory has a batch erasing mode, the batch erasing mode has erased to the data that does not want to erase.

SUMMARY OF THE INVENTION

To solve the above and other problems, according to one aspect of the present invention, A composite flash memory device includes a plural sector flash memory array which is divided to plural sector that is a minimum erasing unit of the flash memory device, a flash memory array storing control commands which control a total system of the composite flash memory device and/or the only composite flash memory device in and sharing I/O line of the plural sector flash memory array, the read operation of the flash memory array is enable when the plural sector flash memory array is gained access.

According to another aspect of the present invention, a composite flash memory device according to claim 1, further includes a selector selecting an single sector erasing mode which the sectors of the flash memory device are erased by a sector unit and a simultaneously plural sector erasing mode that simultaneously erases the sectors of a regular range in the plural sector flash memory device.

BRIEF DESCRIPTION OF THE DRAWINGS

Other aspects and further features of the present invention will become apparent from the following detailed description when read in conjunction with the accompanying drawings, wherein.

DESCRIPTION OF THE PREFERRED EMBODIMENT

A description will now be given of preferred embodiments according to the present invention.

Figure 1:
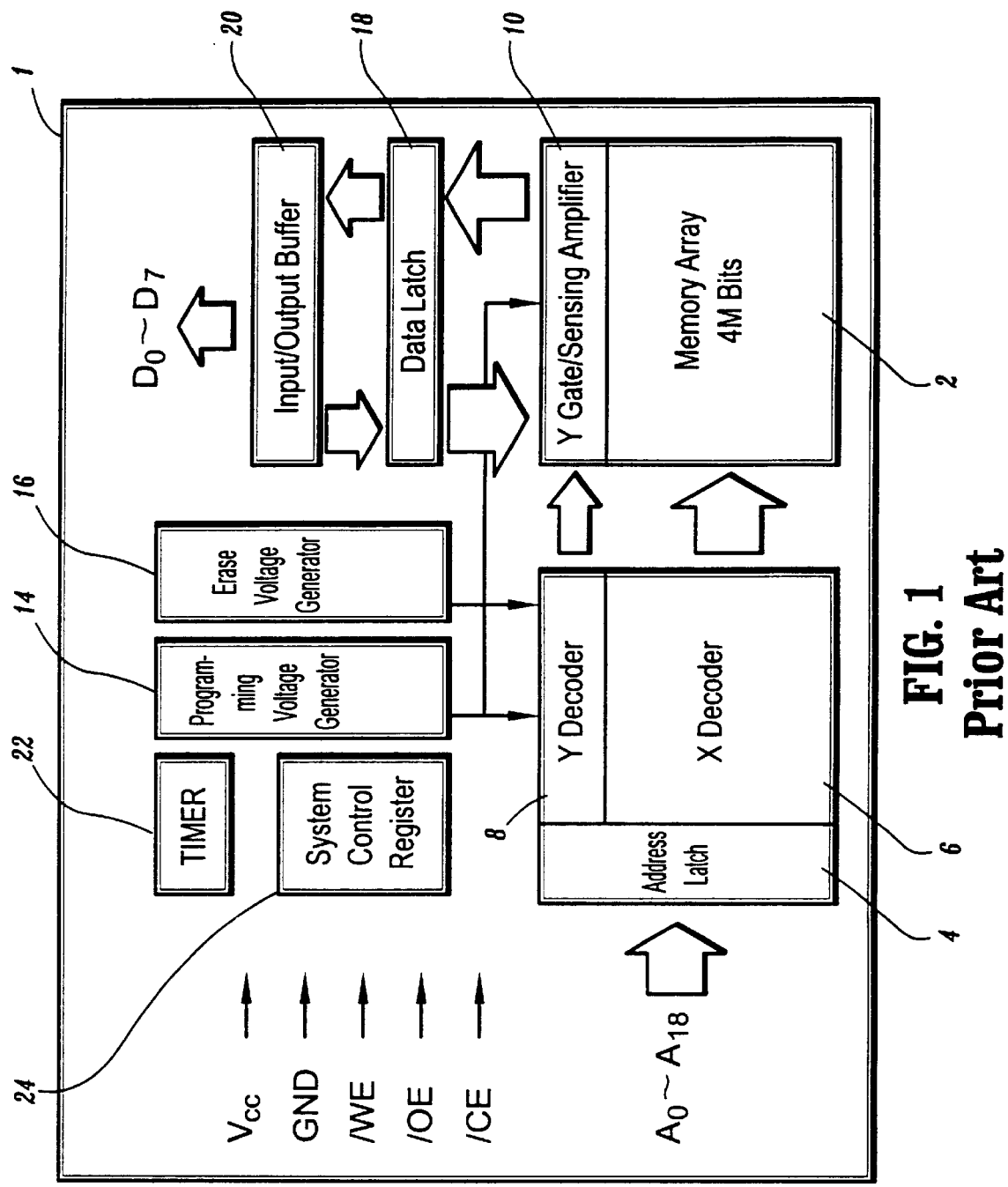
FIG. 1 is a block diagram of the conventional memory system that has a single memory device according to the prior art.
Figure 2:
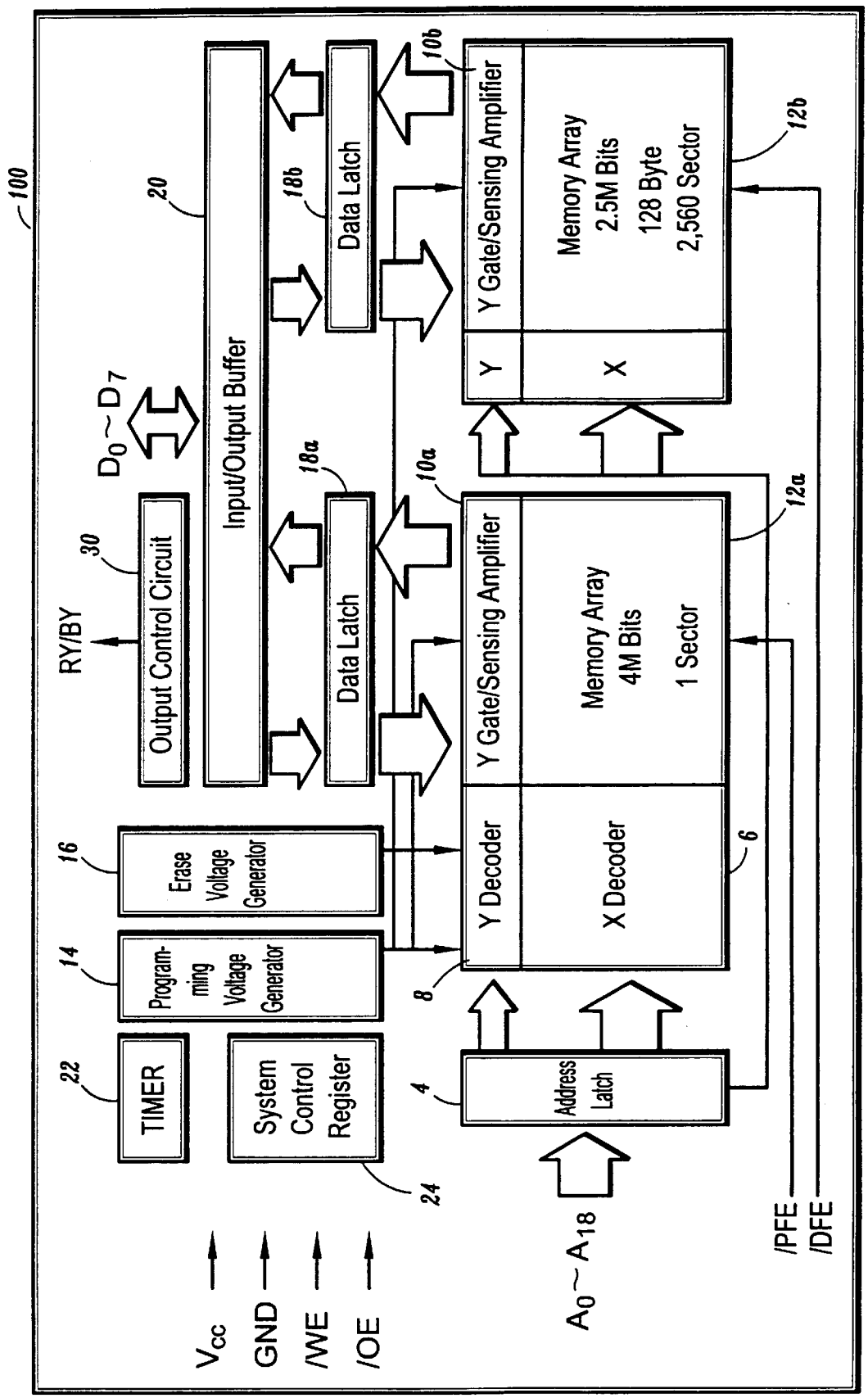
FIG. 2 is a block diagram of the composite memory device according to the present invention.

Referring now to the drawings, wherein like reference numerals designate corresponding structure throughout the views, and referring in particular to FIG. 2, one preferred embodiment of the composite flash memory device 100 according to the present invention includes two flash memory arrays 12A and 12B which has different number of sector each other. The flash memory array 12A is for storing control programs by which a CPU (not shown) controls the total system. The flash memory array 12A is not divided into plural sector, therefore has single sector of 4 M bits.

On the other hand, the flash memory array 12B is for storing data such as image and voice etc and is divided into 2560 sectors, each sector comprised of 128 bytes. Here, the each sector is the minimum unit of the data erasing. The address where was input from the outside is input to an X decoder 8 and also an Y decoder 6 via an address latch 4. As they mentioned above, the X decoder 6 and the Y decoder 8 select the word line and also the data line between the flash memory 12A and the flash memory 12B on the basis of the input address. An access of the flash memory 12A and 12B is selectable by switching between a program flash enable (/PFE) signal and a data flash enable (/DEE) signal. The /PFE signal enables the access to a flash memory 12A. The /DFE signal enables the access to a flash memory 12B. Y gate/sensing amplifier 10A and 10B is provided to sense and select the bit line in the both flash memories 12A and 12B each other. The Y gate/sensing amplifier 10A and 10B are connected to the same input/output buffer 20 via data latch 18A and 18B each other.

A programming voltage generator 14 supplies program voltages into the X decoder 6, the Y decoder 8 and the flash memories 12A and 12B during programming operation. Similarly, an erase voltage generator 16 supplies erasing voltages into the X decoder 6, the Y decoder 8 and the flash memory 12A and 12B during erasing operation.

In this embodiment, an explanation of the /WE signal and the /OE signal omits because the above signals are same as the above-related art. But, the present embodiment employs the /PFE signal and the /DFE signal such as alternate the chip enable signal (/CE).

An output control circuit 30 generates a ready signal (RY) or a busy signal (BY) and output them to host system (not shown). The RY signal and the BY signal show whether during an automatic algorithm execution or not.

the X decoder 6 and the Y decoder 8 are provided with each flash memory 12A and 12B each other in order to be gotten access to.

When the CPU order the writing operation, the writing algorithm is automatically carried out. When the CPU order the erasing operation, the CPU designates the composite flash memory device 100 whether one sector or certain range of sectors in the flash memory array 12B. The ordered flash memory device 100 automatically carries out the erasing operation on the basis of the erasing mode whether single sector or certain ranges of the sectors in the flash memory array 12B. When plural sector erasing mode is selected, the selected first sector of the ranges is erased at first and then the next sector is sequentially erased until the selected final sector by the automatic erasing algorithm.

The selection between the /DFE signal and the /PFE signal is capable of getting access to the flash memory array 12A which stores the program software during the writing or the erasing operation starts when the data flash memory array 12B is selected by the DFE signal.

Accordingly, the reading access to the data of the flash memory array 12A becomes enable when the data of the flash memory array 12B is erased or written.

Figure 3:
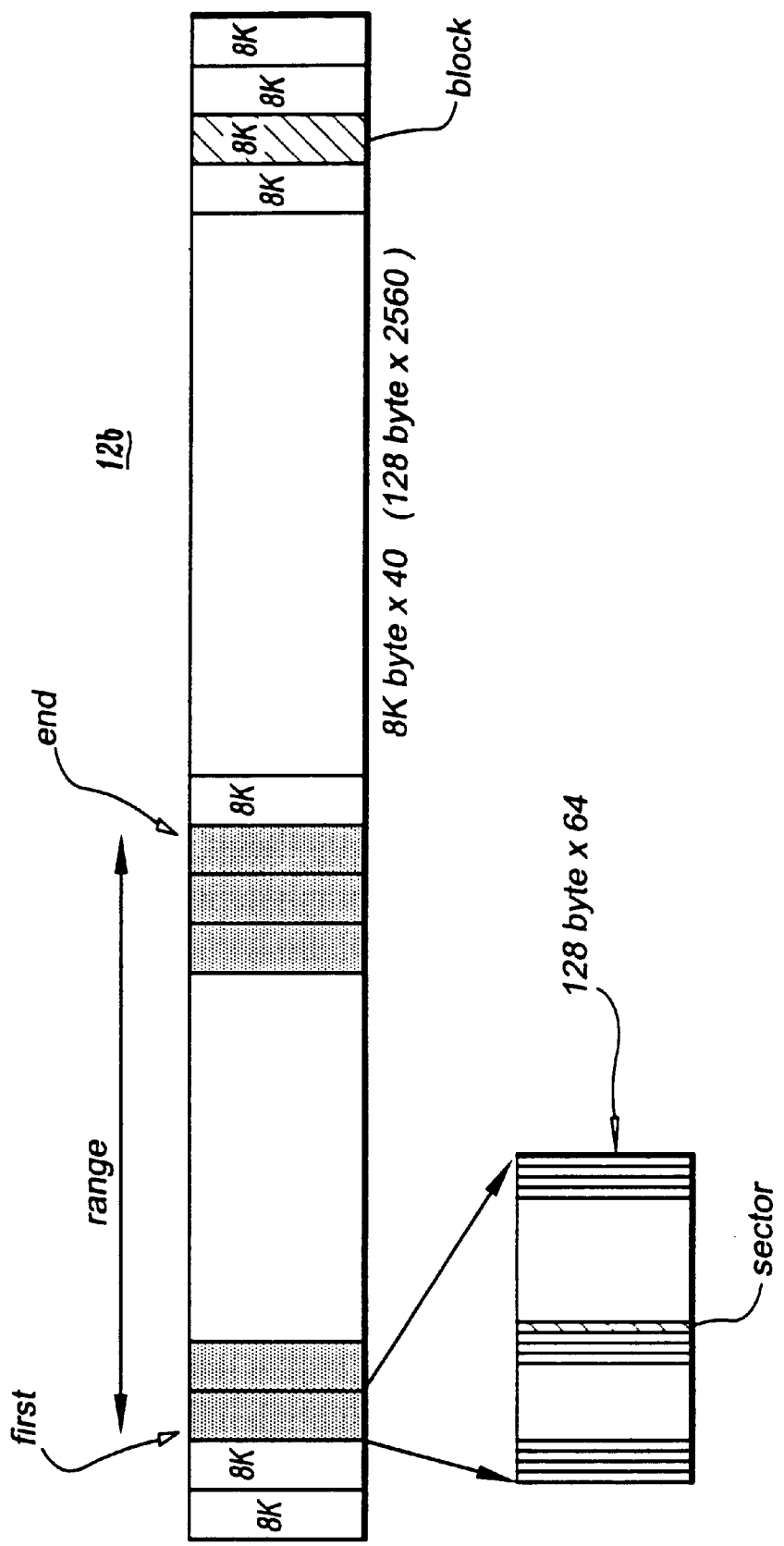
FIG. 3 is a structure of the flash memory according to the present invention.

Now referring to the FIG. 3, the flash memory array 12B is of the structure which has plural block made up of 64 sectors each, each sector comprises of 128 bytes. Therefore, the one block of the flash memory array 12B is total 8 K bytes.

In this embodiment, the composite flash memory device 100 is capable of erasing the only one sector comprised of 128-byte unit, also erasing one block comprised of 8 K byte unit (64 sectors) and furthermore, erasing certain range of plural 8 K byte unit.

In the case that the composite flash memory device 100 erases the certain range of the sectors, or the block, the selected first sector of the range is erased at first and the next sector is sequentially erased along the sector order.

Figure 4:
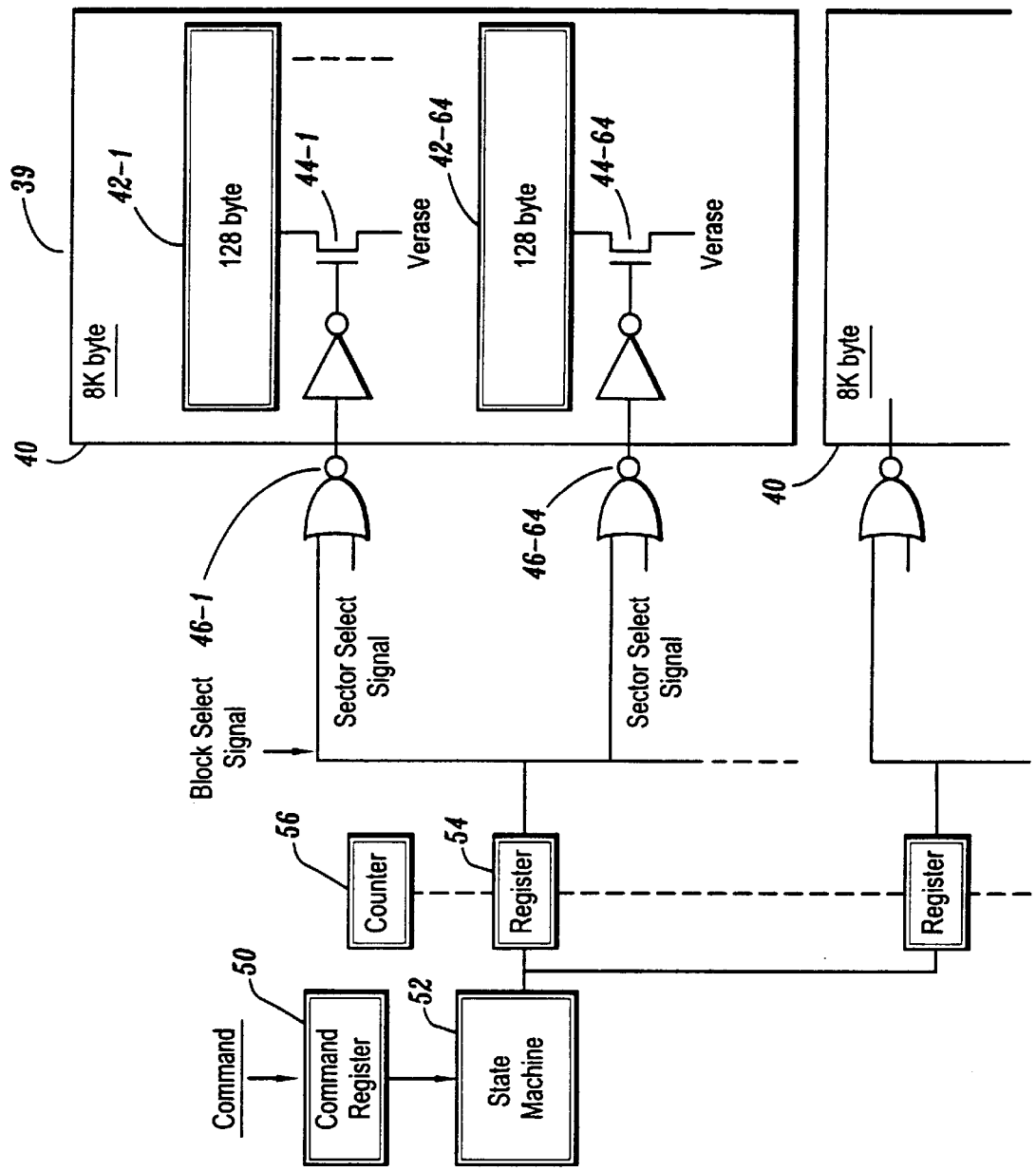
FIG. 4 is a block diagram for the selection whether the single sector erasing mode which a single sector is erased or the plural sector erasing mode which the plural sector are erased of the selector of the composite memory device according to the present invention.

Now referring to FIG. 4, a selector circuit 39 is located in the composite flash memory device 100 and can select two erasing modes. One mode is a single erasing mode that selected only one sector of the flash memory 12B is erased. The other mode is a block unit erasing mode that the selected single block or plural block corresponding to the selected range of the flash memory 12B is erased.

The block unit 40 is total 8 K byte comprised of 64 sectors as shown from 42-1 to 42-64. Each sector from 42-1 to 42-64 is connected to a MOS transistor in order to apply erasing voltage Verase to the memory device of the each sector. Gate electrode of the each MOS transistor from 44-1 to 44-64 is connected to NOR circuit and OR circuit from 46-1 to 46-64. Sector select signal and block select signal are applied to the gate electrode of the each MOS transistor from 44-1 to 44-64 via the NOR circuit and OR circuit from 46-1 to 46-64.

When the block unit-erasing mode is selected, the corresponding command is applied to a state machine 52 by way of a command register 50. Sequentially, the command is applied to the registers 54 corresponding to single or plural block of the selected range from first block to end block and is stored in registers 54 of each block. When the command is applied to the registers 54 corresponding to the selected range, a counter 56 sequentially designates the blocks. The block select signal is applied to the each block via the NOR circuit and OR circuit from 46-1 to 46-64. Finally, when the certain selected blocks receive the block select signal, block unit with the turn that received the signal carries out the erasing operation. If the single block is selected, the erasing operation of a single block unit is also possible.

When the sector unit-erasing mode is selected, the corresponding command is applied to the state machine 52 by way of the command register 50. Sequentially, the command is applied to the registers 54 of the selected block and is stored in registers 54. When the command is applied to the registers 54, the counter 56 designates the block. The sector unit signal is applied to the block via the NOR circuit and the OR circuit from 46-1 to 46-64. Finally, when the selected block receive the sector unit signal, the erasing operation is carried out. If the plural sector in the above block is selected, the erasing operation of plural sector is also possible.

Figure 5:
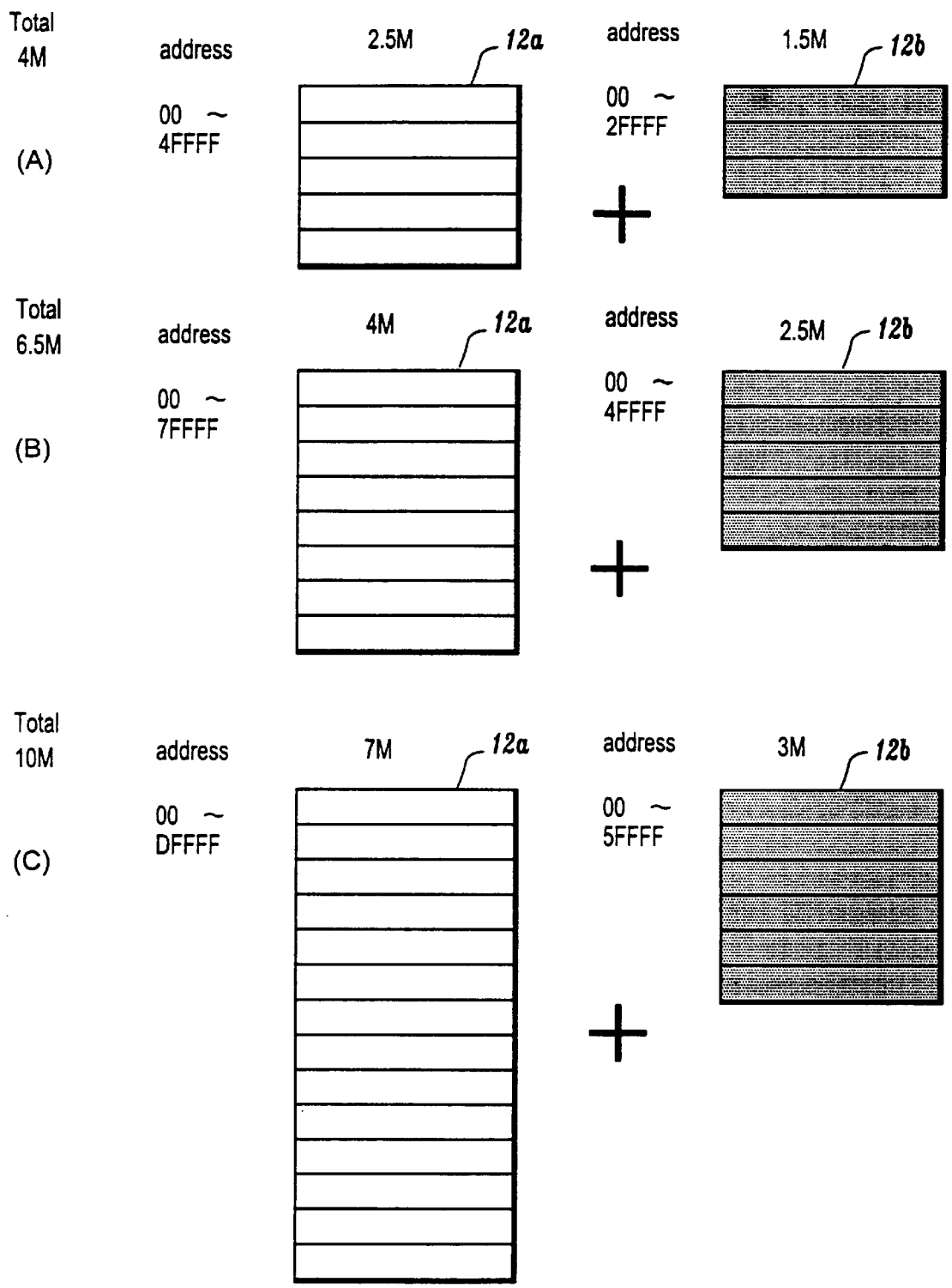
FIG. 5 is a conceptional block diagram of the relation between the control signal block and the data block according to the present invention.

Now referring to FIG. 5, as for the capacity between the flash memory 12A and the flash memory 12B, various combinations are conceivable by the usage of the user. The present invention is capable of employing various combination of the capacity between the above flash memories.

Referring to FIG. 5 (A), the flash memory 12A which is divided into 5 sectors is 2.5 M bytes and the flash memory 12B is divided into 3 sectors is 1.5 M bytes. The total capacity of the memory is 4-M bytes. The flash memory 12A employs a range of address from 00 to 4FFFF of the address space for storing programming software. On the other hand, the flash memory 12B employs a range of address from 00 to 2FFFF for storing data.

Referring to FIG. 5 (B), the flash memory 12A which is divided into 8 sectors is 4 M bytes and the flash memory 12B is divided into 5 sectors is 2.5 M bytes. The total capacity of the memory is 6.5-M bytes. The flash memory 12A employs a range of address from 00 to 7FFFF of the address space for storing programming software. On the other hand, the flash memory 12B employs a range of address from 00 to 4FFFF for storing data.

Referring to FIG. 5 (C), the flash memory 12A which is divided into 14 sectors is 7 M bytes and the flash memory 12B is divided into 6 sectors is 3 M bytes. The total capacity of the memory is 10-M bytes. The flash memory 12A employs a range of address from 00 to DFFFF of the address space for storing programming software. On the other hand, the flash memory 12B employs a range of address from 00 to 5FFFF for storing data.

The present invention is capable of employing various combination of the capacity of the flash memories 12A and 12B.

Figure 6:
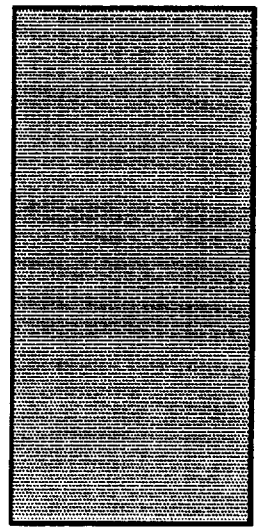
FIG. 6 is a conceptional block diagram of the relation between the control signal block and the data block which both blocks are located in same memory area according to the present invention.
Figure 6:
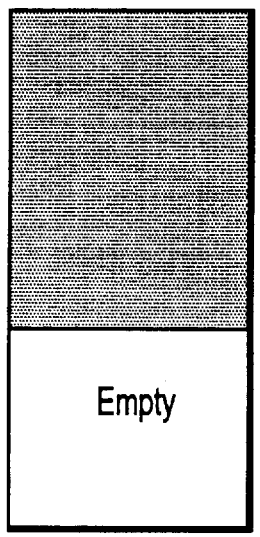

Referring to FIG. 6, the present invention is capable of employing divided capacity areas of a flash memory as alternation of the flash memories 12A and 12B.

The single flash memory is divided into a program store area and a data store area. The program store area and the data store area are allocated to deferent range of the address in the single flash memory.

The exchange of between the program store area and the data store area is carried out by the /PFE signal and /DFE signal as same as the above embodiment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts, as well as implementation in software, hardware, or a combination of. both within the principles of the invention to the full extent indicated by 10 the broad general meaning of the terms in which the appended claims are expressed.

The present document incorporates by reference the entire contents of Japanese priority document, 09-149975 filed in Japan on May 23, 1997.

What is claimed is:

1. A memory circuitry comprising:
   a first flash memory array having a first predetermined number of blocks; and
   a second flash memory array having a second predetermined number of blocks and sharing input/output lines with the first flash memory array,
   wherein the first predetermined number of blocks is different than the second predetermined number of blocks, wherein more than two of the blocks of the first flash memory array are minimum erasing units of the flash memory device, and wherein a read operation is enabled in the second flash memory array when the first flash memory array is written or erased.

2. The memory circuitry according to claim 1, further comprising:
   a selector for selecting a single block erasing mode in which the blocks of the first flash memory array are erased by a block and a simultaneously plural block erasing mode that simultaneously erases the blocks of a regular range in the first flash memory array.

3. The memory circuitry as recited in claim 1, wherein the first flash memory array stores data and the second flash memory array stores program.

4. The memory circuitry as recited in claim 1, further comprising internal program/erase control circuitry for inputting to and erasing from the first and second flash memory arrays.

5. The memory circuitry as recited in claim 1, wherein the first flash memory array may be erased electrically at block level.

6. A memory circuitry comprising:
   a first flash memory array having a first predetermined number of sectors; and
   a second flash memory array having a second predetermined number of sectors and sharing input/output lines with the first flash memory array, wherein the first predetermined number of sectors is different than the second predetermined number of sectors, wherein more than two of the sectors of the first flash memory array are minimum erasing units of the flash memory device, and wherein a read operation is enabled in the second flash memory array when the first flash memory array is written or erased.

7. The memory circuitry according to claim 6, further comprising:

a selector for selecting a single block erasing mode in which the sectors of the first flash memory array are erased by a sector and a simultaneously plural sector erasing mode that simultaneously erases the sectors of a regular range in the first flash memory array.

8. The memory circuitry as recited in claim 6, wherein the first flash memory array stores data and the second flash memory array stores program.

9. The memory circuitry as recited in claim 6, further comprising internal program/erase control circuitry for inputting to and erasing from the first and second flash memory arrays.

10. The memory circuitry as recited in claim 6, wherein the first flash memory array may be erased electrically at block level.

11. An electronic equipment which employs the memory circuitry of claim 1.

12. A computerized personal organizer which employs the memory circuitry of claim 1.

13. A handset which employs the memory circuitry of claim 1.

14. A voice recognition device which employs the memory circuitry of claim 1.

15. A voice memory device which employs the memory circuitry of claim 1.

16. A computer which employs the memory circuitry of claim 1.

17. A handy phone w the memory circuitry of claim 1.

* * * * *

UNITED STATES PATENT AND TRADEMARK OFFICE
CERTIFICATE OF CORRECTION

PATENT NO. : 6,545,916 B2  
DATED : April 8, 2003  
INVENTOR(S) : Minoru Fukuda et al.

It is certified that error appears in the above-identified patent and that said Letters Patent is hereby corrected as shown below:

Title page,
Item [56], References Cited, OTHER PUBLICATIONS, insert the following:

-- OTHER PUBLICATIONS
Atmel, 4 Megabit 5-volt Flash with 256K E$^2$PROM Memory, AT29C432 Concurrent Flash, pp. 1-11.
STMicroelectronics, "Advanced Architecture Flash Memory - Computers and Peripherals", pp. 1-2, 1999.
STMicroelectronics, "32 Mbit (2Mbx16, Dual Bank, Page) Low Voltage Flash Memory", pp. 1-38, October, 1999.
AMD, "Am29DL800T/Am29DL800B - 8 Megabit (1MX8-Bit/512 KX16-Bit) CMOS 3.0 Volt-only, Simultaneous Operation Flash Memory", pp. 1-10, May 1997. --

Column 8,
Line 17, replace claim 17 with the following:

-- 17. A handy phone which employs the memory circuitry of claim 1. --

Signed and Sealed this

Twenty-second Day of June, 2004

JON W. DUDAS
*Acting Director of the United States Patent and Trademark Office*